(12) United States Patent
Tanaka et al.

(10) Patent No.: US 11,916,529 B2
(45) Date of Patent: Feb. 27, 2024

(54) MATCHING CIRCUIT

(71) Applicant: Murata Manufacturing Co., Ltd., Kyoto (JP)

(72) Inventors: Yusuke Tanaka, Kyoto (JP); Hiroki Shounai, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/730,128

(22) Filed: Oct. 11, 2017

(65) Prior Publication Data

US 2018/0102754 A1 Apr. 12, 2018

(30) Foreign Application Priority Data

Oct. 12, 2016 (JP) .................................. 2016-201146
Jan. 5, 2017 (JP) .................................. 2017-000664

(51) Int. Cl.
*H03H 7/38* (2006.01)

(52) U.S. Cl.
CPC ..................................... *H03H 7/38* (2013.01)

(58) Field of Classification Search
CPC ....................................................... H03H 7/38
USPC .......................................................... 333/32
See application file for complete search history.

(56) References Cited

U.S. PATENT DOCUMENTS

| 7,761,067 | B1* | 7/2010 | Tsai | H04B 1/0475 |
| | | | | 455/114.2 |
| 8,497,744 | B1* | 7/2013 | Wright | H03H 7/38 |
| | | | | 333/32 |
| 2003/0001693 | A1 | 1/2003 | Guitton | |
| 2006/0141978 | A1* | 6/2006 | Liu | H03H 7/1766 |
| | | | | 455/333 |
| 2007/0123175 | A1* | 5/2007 | Watanabe | H03H 7/463 |
| | | | | 455/78 |
| 2007/0241839 | A1* | 10/2007 | Taniguchi | H03H 7/09 |
| | | | | 333/185 |
| 2008/0042774 | A1 | 2/2008 | Talbot | |
| 2008/0061901 | A1* | 3/2008 | Gilmore | H03H 7/40 |
| | | | | 333/17.3 |
| 2015/0280685 | A1* | 10/2015 | Goumas | H03H 7/383 |
| | | | | 333/35 |
| 2015/0357989 | A1* | 12/2015 | Ma | H03H 7/38 |
| | | | | 455/572 |
| 2017/0019083 | A1* | 1/2017 | Fukae | H03H 1/02 |

FOREIGN PATENT DOCUMENTS

JP 5858280 B2 2/2016
TW 200824271 A 6/2008

* cited by examiner

*Primary Examiner* — Samuel S Outten
(74) *Attorney, Agent, or Firm* — Pearne & Gordon LLP

(57) ABSTRACT

A matching circuit performs output impedance matching for an amplifier that amplifies an input signal and outputs an amplified signal. The matching circuit includes a low pass filter and a high pass filter. The ground of the low pass filter and the ground of the high pass filter are isolated from each other.

6 Claims, 17 Drawing Sheets

MATCHING CIRCUIT

This application claims priority from Japanese Patent Application No. 2017-000664 filed on Jan. 5, 2017 and Japanese Patent Application No. 2016-201146 filed on Oct. 12, 2016. The content of these applications are incorporated herein by reference in their entirety.

BACKGROUND

The present disclosure relates to a matching circuit.

Mobile communication terminals such as cellular phones use a power amplification module that amplifies a radio frequency (RF) signal transmitted to a base station. As this type of power amplification module, Japanese Patent No. 5858280 discloses a power amplification module that includes a terminating circuit that attenuates the second harmonic component of an RF signal output from an amplifier, and a matching circuit that performs output impedance matching for the amplifier.

In this regard, the inventor has found through research that if circuit elements constituting a matching circuit share a common ground, interference between the circuit elements makes it difficult to sufficiently attenuate the harmonic components of an RF signal.

BRIEF SUMMARY

Accordingly, the present disclosure provides a matching circuit that enables sufficient attenuation of the harmonic components of an amplified signal.

According to embodiments of the present disclosure, there is provided a matching circuit that performs output impedance matching for an amplifier that amplifies an input signal and outputs an amplified signal, the matching circuit including a low pass filter and a high pass filter. The ground of the low pass filter and the ground of the high pass filter are isolated from each other.

According to the embodiments of the present disclosure, the ground of the low pass filter and the ground of the high pass filter are isolated from each other. This configuration reduces interference between the low pass filter and the high pass filter to enable sufficient attenuation of the harmonic components of the amplified signal.

Other features, elements, and characteristics of the present disclosure will become more apparent from the following detailed description of embodiments of the present disclosure with reference to the attached drawings.

DETAILED DESCRIPTION

Figure 1:
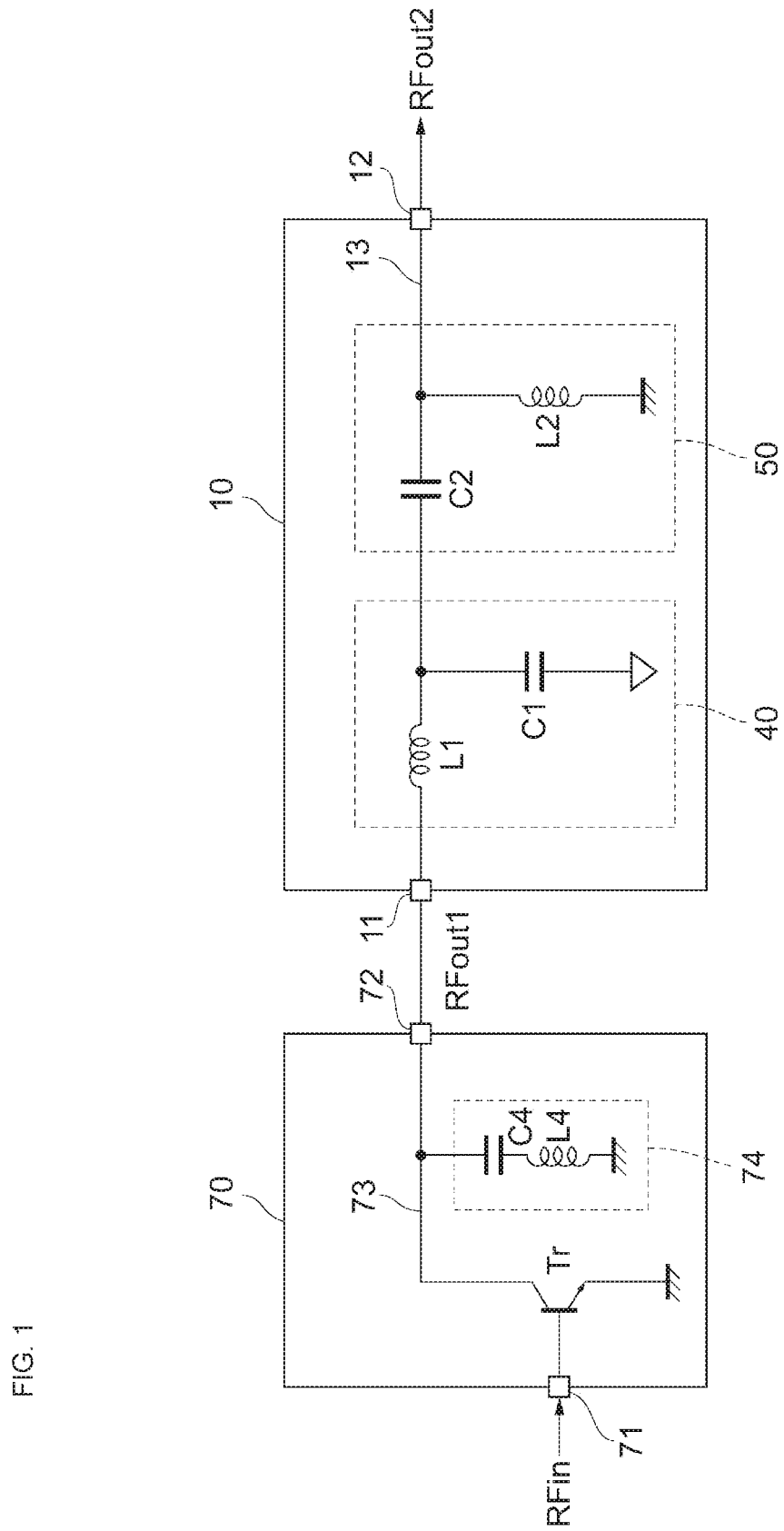
FIG. 1 illustrates a circuit configuration of a matching circuit according to Embodiment 1 of the present disclosure.

Hereinafter, embodiments of the present disclosure will be described with reference to the drawings. Like circuit elements will be herein designated by like reference numerals to avoid repetitive descriptions.

FIG. 1 illustrates a circuit configuration of a matching circuit 10 according to Embodiment 1 of the present disclosure. The matching circuit 10 is disposed between an amplifier 70 and its subsequent circuit (e.g., a switching element) to match the output impedance of the amplifier 70 to the input impedance of the subsequent circuit. The amplifier 70 amplifies an input signal RFin input to an input node 71, and outputs an amplified signal RFout1 from an output node 72, for example. The amplifier 70 includes a common-emitter transistor Tr that amplifies the input signal RFin that is input to a base terminal via the input node 71, and outputs the resulting signal from a collector terminal as the amplified signal RFout1. The input signal RFin is, for example, an RF signal of a predetermined communication frequency band. The amplifier 70 includes, for example, a terminating circuit 74 connected between a signal line 73 and the ground. The signal line 73 transmits, to the output node 72, the amplified signal RFout1 output from the collector terminal of the transistor Tr. The terminating circuit 74 attenuates the second harmonic component of the amplified signal RFout1. The terminating circuit 74 is, for example, a series resonant circuit including a capacitor element C4 and an inductor element L4. The capacitance value of the capacitor element C4 and the inductance value of the inductor element L4 are selected such that the second harmonic frequency of the amplified signal RFout1 matches the series resonant frequency of the series resonant circuit. As a result, the majority of the second harmonic component of the amplified signal RFout1 flows to the ground from the signal line 73 through the terminating circuit 74. This enables attenuation of the majority of the second harmonic component of the amplified signal RFout1 output from the output node 72. The transistor Tr is, for example, a heterojunction bipolar transistor. The transistor Tr used is not limited to a bipolar transistor but may be, for example, a field effect transistor.

The matching circuit 10 includes a low pass filter 40, a high pass filter 50, an input node 11, an output node 12, and a signal line 13. The matching circuit 10 performs output impedance matching for the amplifier 70, and attenuates the harmonic components of the amplified signal RFout1 input to the input node 11 and outputs the resulting signal from the output node 12 as an amplified signal RFout2. The signal line 13 connects the input node 11 with the output node 12. The low pass filter 40 includes an inductor element L1 connected in series with the signal line 13, and a capacitor element C1 connected in shunt between the signal line 13 and the ground. The high pass filter 50 includes a capacitor element C2 connected in series with the signal line 13, and an inductor element L2 connected in shunt between the signal line 13 and the ground. For the low pass filter 40, changes in impedance on the high frequency side are greater than changes in impedance on the low frequency side. In contrast, for the high pass filter 50, changes in impedance on the low frequency side are greater than changes in impedance on the high frequency side. Accordingly, using the low pass filter 40 and the high pass filter 50 in combination allows the changes in their impedance to be canceled out. This allows for wider impedance bandwidth of the matching circuit 10 in the carrier frequency band (the fundamental frequency band of the carrier wave) of the amplified signal RFout1. The low pass filter 40 attenuates a harmonic component (e.g., the second, third, or higher harmonic component) of the amplified signal RFout1.

Figure 2:
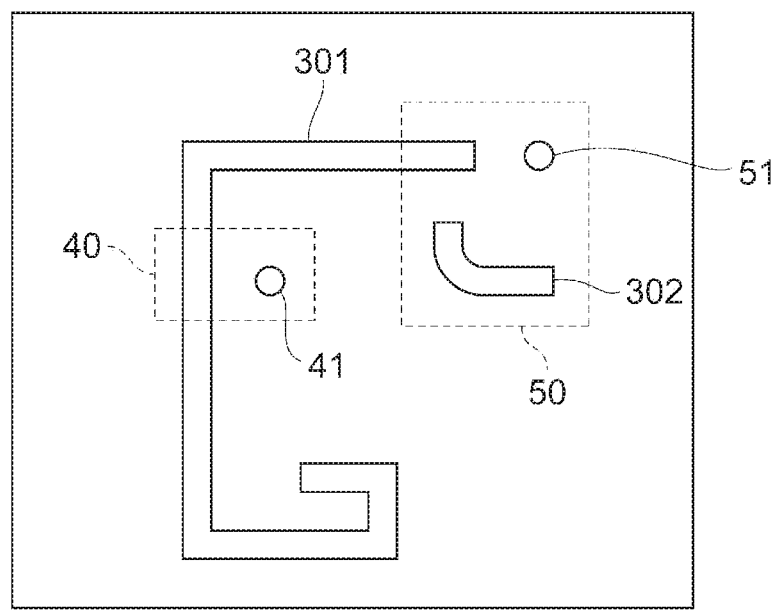
FIG. 2 schematically illustrates a wiring layout of the matching circuit according to Embodiment 1 of the present disclosure.

FIG. 2 schematically illustrates a wiring layout of the matching circuit 10 according to Embodiment 1. In FIG. 2, reference numerals 301 and 302 each denote a wiring pattern of the matching circuit 10. Reference numeral 41 denotes the ground of the low pass filter 40, and reference numeral 51 denotes the ground of the high pass filter 50. As illustrated in FIG. 2, the ground 41 of the low pass filter 40 and the ground 51 of the high pass filter 50 are isolated from each other.

Figure 3:
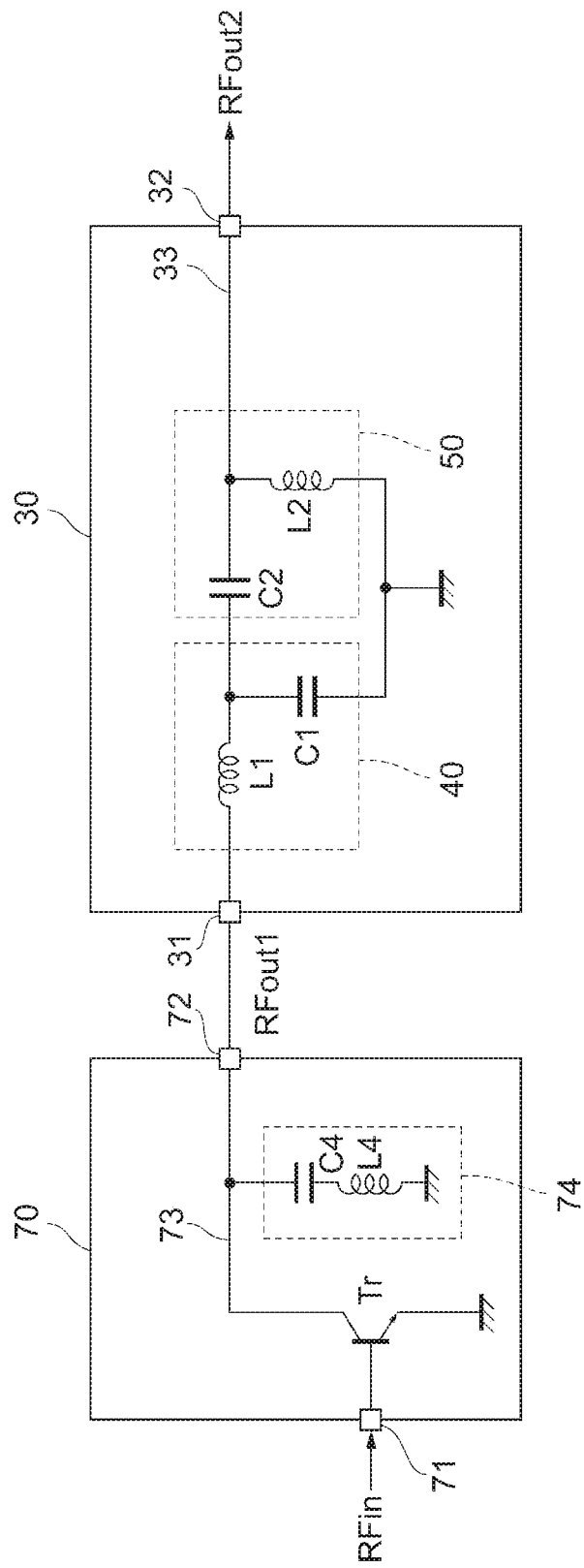
FIG. 3 illustrates a circuit configuration of a matching circuit according to a comparative example.

FIG. 3 illustrates a circuit configuration of a matching circuit 30 according to a comparative example. The matching circuit 30 includes the low pass filter 40, the high pass filter 50, an input node 31, an output node 32, and a signal line 33. The signal line 33 connects the input node 31 with the output node 32. The low pass filter 40 includes the inductor element L1 connected in series with the signal line 33, and the capacitor element C1 connected in shunt between the signal line 33 and the ground. The high pass filter 50 includes the capacitor element C2 connected in series with the signal line 33, and the inductor element L2 connected in shunt between the signal line 33 and the ground. The matching circuit 30 differs from the matching circuit 10 in that the low pass filter 40 and the high pass filter 50 of the matching circuit 30 share a common ground.

Figure 4:
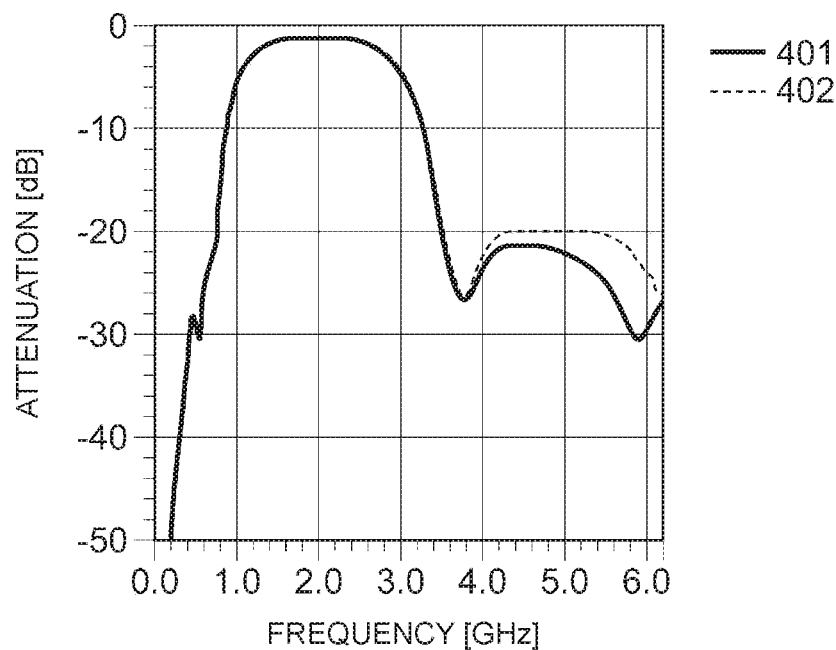
FIG. 4 is a graph illustrating simulation results of signal loss of the matching circuit according to Embodiment 1 of the present disclosure and of the matching circuit according to the comparative example.
Figure 5:
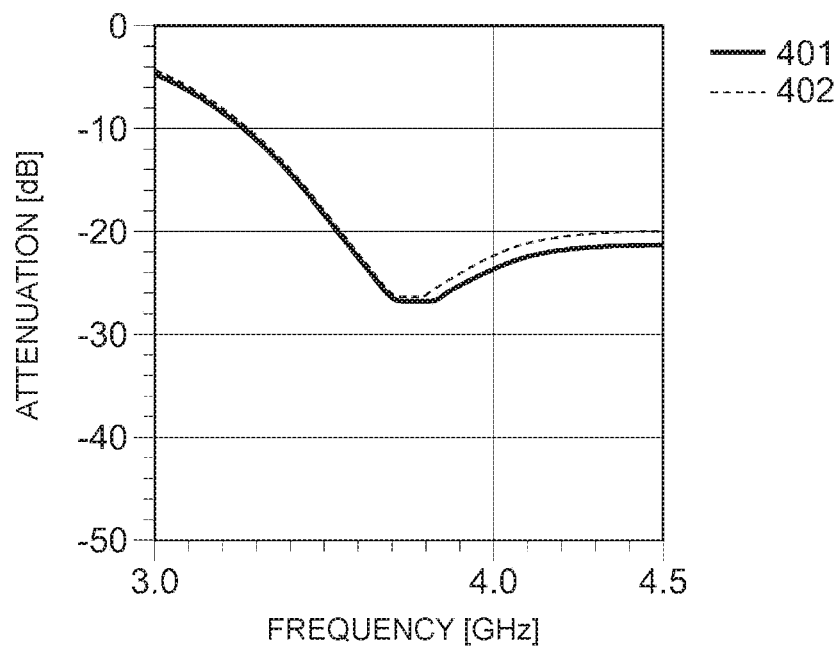
FIG. 5 is a graph illustrating simulation results of signal loss of the matching circuit according to Embodiment 1 of the present disclosure and of the matching circuit according to the comparative example.
Figure 6:
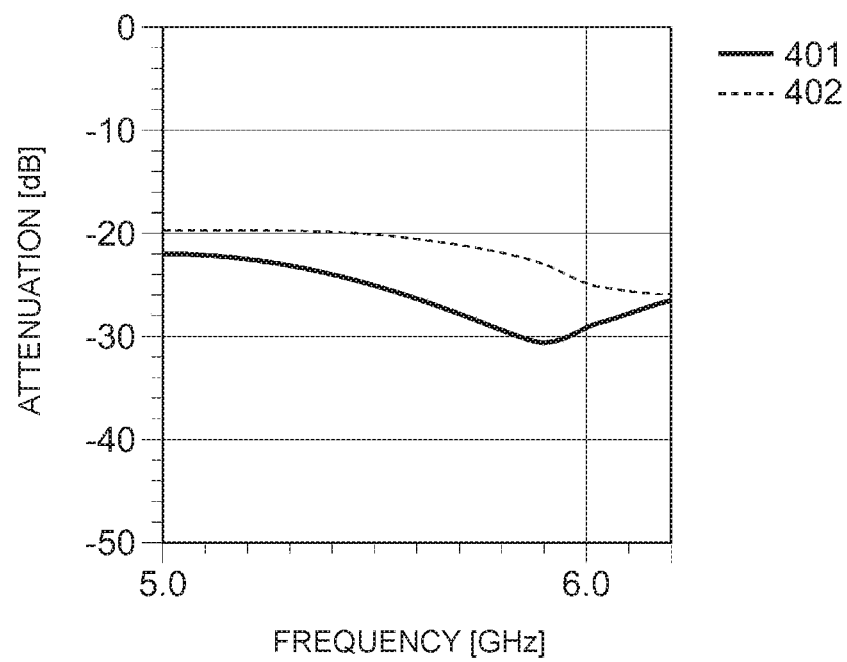
FIG. 6 is a graph illustrating simulation results of signal loss of the matching circuit according to Embodiment 1 of the present disclosure and of the matching circuit according to the comparative example.

FIG. 4 illustrates results of a simulation (to be referred to as "first simulation" hereinafter) of the respective signal losses of the matching circuits 10 and 30. In FIG. 4, the horizontal axis represents the frequency [GHz] of the amplified signal RFout1, and the vertical axis represents signal loss [dB]. The first simulation assumes that the carrier frequency band of the amplified signal RFout1 ranges from 1.710 GHz to 2.025 GHz. The first simulation also assumes that the low pass filter 40 of each of the matching circuits 10 and 30 attenuates the third harmonic component of the amplified signal RFout1. Reference numeral 401 indicates simulation results of signal loss of the matching circuit 10 obtained by the first simulation. Reference numeral 402 indicates simulation results of signal loss of the matching circuit 30 obtained by the first simulation. FIG. 5 is an enlarged view of the simulation results of FIG. 4 in the vicinity of the second harmonic frequency band of the amplified signal RFout1. FIG. 6 is an enlarged view of the simulation results of FIG. 4 in the vicinity of the third harmonic frequency band of the amplified signal RFout1. It is appreciated from the results of the first simulation illustrated in FIGS. 4 to 6 that isolating the ground 41 of the low pass filter 40 and the ground 51 of the high pass filter 50 from each other makes it possible to improve signal loss for the second and third harmonic components by about 0.6 dB to about 6.0 dB. This is presumably due to reduced interference between the low pass filter 40 and the high pass filter 50 achieved by isolating the ground 41 of the low pass filter 40 and the ground 51 of the high pass filter 50 from each other. It has been found that the signal loss of the matching circuit 10 is improved in comparison to the signal loss of the matching circuit 30 also for cases where the low pass filter 40 of each of the matching circuits 10 and 30 attenuates the second harmonic component of the amplified signal RFout1 or the fourth or higher harmonic component of the amplified signal RFout1.

Figure 7:
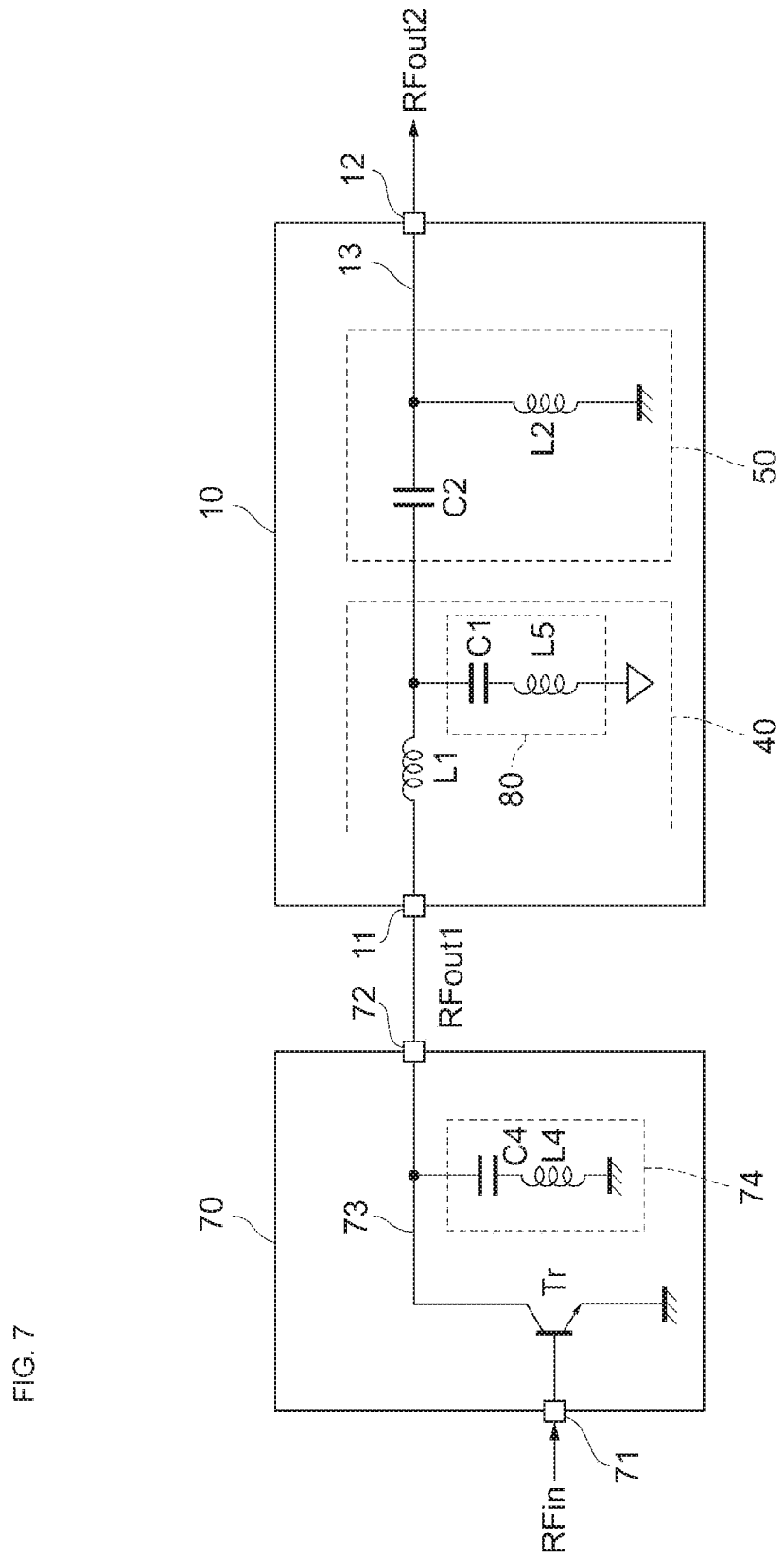
FIG. 7 illustrates a circuit configuration of the matching circuit according to Embodiment 1 of the present disclosure.

As illustrated in FIG. 7, the low pass filter 40 of the matching circuit 10 may include a high frequency terminating circuit 80. The high frequency terminating circuit 80 is an LC series resonant circuit including the capacitor element C1 and an inductor element L5 that are connected in series between the signal line 13 and the ground. The series resonant frequency of the LC series resonant circuit matches the frequency of a harmonic component (e.g., the second, third, or higher harmonic component) of the amplified signal RFout1. This configuration enables the high frequency terminating circuit 80 to attenuate a harmonic component of the amplified signal RFout1.

With the matching circuit 10 according to Embodiment 1, the ground 41 of the low pass filter 40 and the ground 51 of the high pass filter 50 are isolated from each other. This configuration allows for reduced interference between the low pass filter 40 and the high pass filter 50. If the grounds 41 and 51 are made common, this may cause a signal that has not passed through the low pass filter 40 to enter the high pass filter 50 via the ground 41 or 51. Another problem with this configuration is that as the number of the circuit elements connected to the ground 41 or 51 increases, the impedance of the ground 41 or 51 increases, which makes it difficult to obtain an ideal ground. Accordingly, the grounds 41 and 51 are isolated from each other to prevent the signal that has not passed through the low pass filter 40 from entering the high pass filter 50. Furthermore, the isolation of the grounds 41 and 51 from each other leads to reduced number of circuit elements connected to each of the grounds 41 and 51, which makes each of the grounds 41 and 51 closer to an ideal ground. This configuration enables sufficient attenuation of the harmonic components of the amplified signal RFout1.

Figure 8:
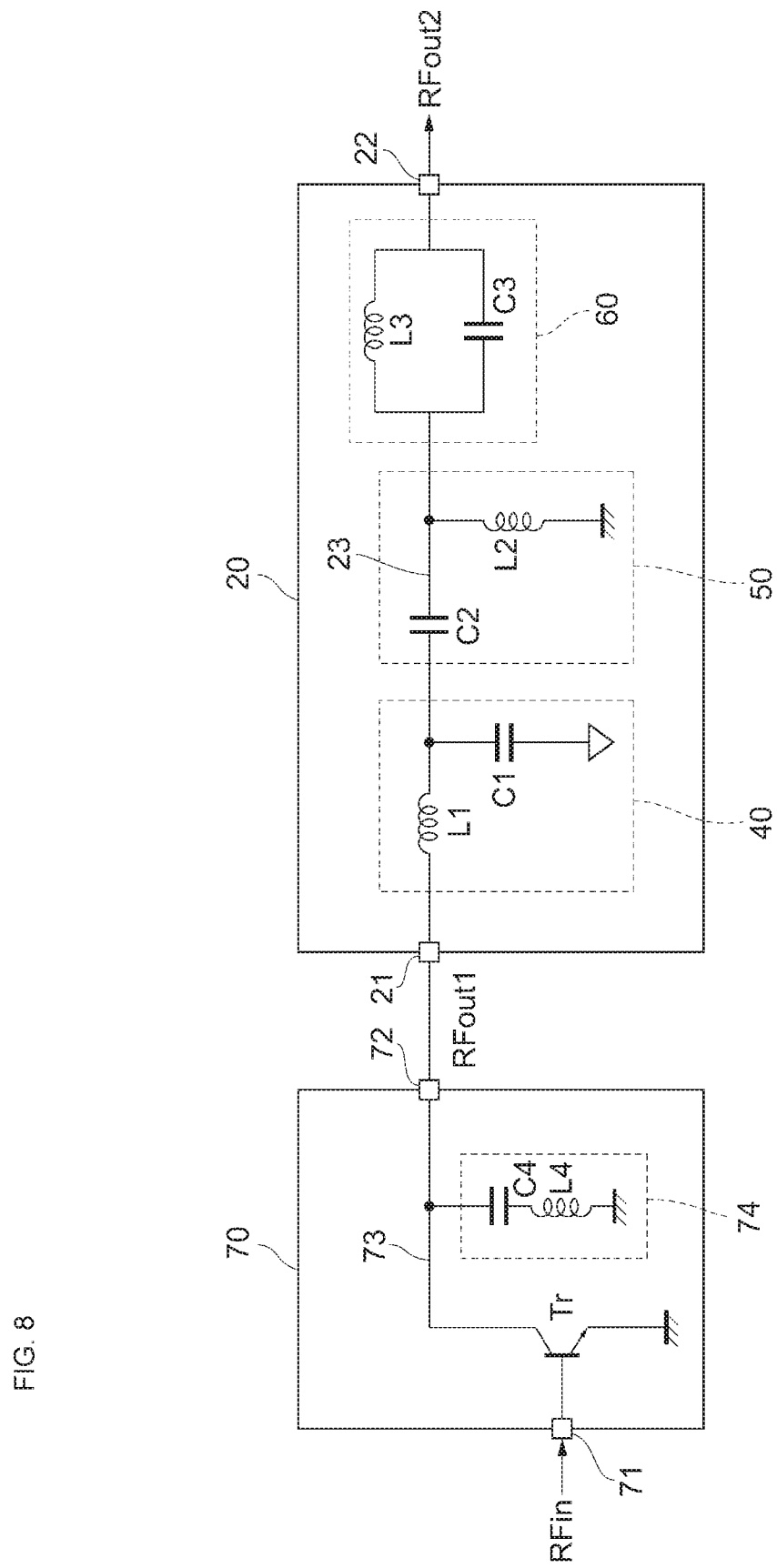
FIG. 8 illustrates a circuit configuration of a matching circuit according to Embodiment 2 of the present disclosure.

FIG. 8 illustrates a circuit configuration of a matching circuit 20 according to Embodiment 2 of the present disclosure. The matching circuit 20 according to Embodiment 2 differs from the matching circuit 10 according to Embodiment 1 in that the matching circuit 20 includes a parallel resonant circuit 60. The matching circuit 20 includes the low pass filter 40, the high pass filter 50, an input node 21, an output node 22, and a signal line 23. The signal line 23 connects the input node 21 with the output node 22. The low pass filter 40 includes the inductor element L1 connected in series with the signal line 23, and the capacitor element C1 connected in shunt between the signal line 23 and the ground. The high pass filter 50 includes the capacitor element C2 connected in series with the signal line 23, and the inductor element L2 connected in shunt between the signal line 23 and the ground. The parallel resonant circuit 60 includes an inductor element L3 connected in series with the signal line 23, and a capacitor element C3 connected in series with the signal line 23. The inductor element L3 and the capacitor element C3 are connected in parallel. The parallel resonant circuit 60 attenuates a harmonic component (e.g., the second, third, or higher harmonic component) of the amplified signal RFout1. The parallel resonant circuit 60 may attenuate a harmonic component different from the harmonic component attenuated by the low pass filter 40. The matching circuit 20 according to Embodiment 2 is the same as the matching circuit 10 according to Embodiment 1 in that the ground of the low pass filter 40 and the ground of the high pass filter 50 are isolated from each other.

Figure 9:
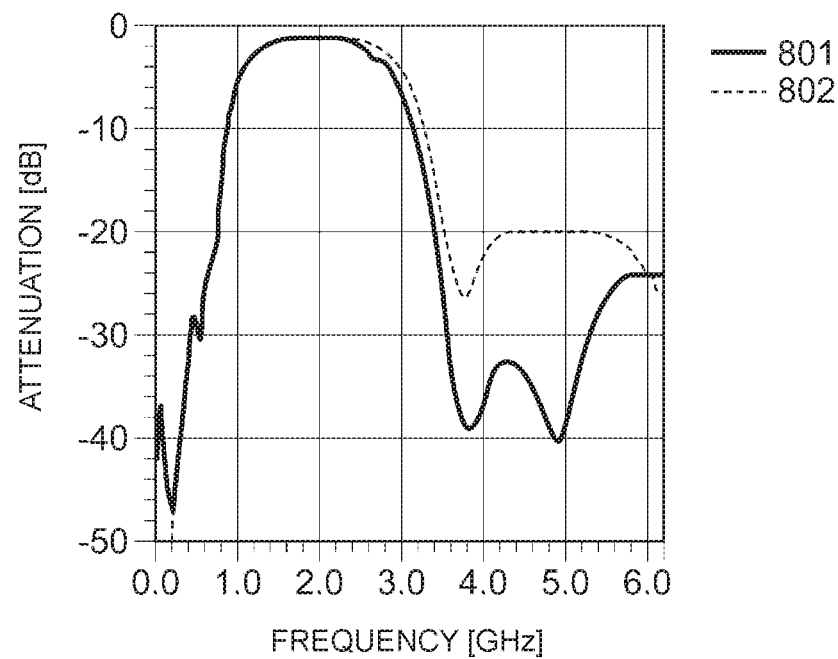
FIG. 9 is a graph illustrating simulation results of signal loss of the matching circuit according to Embodiment 1 of the present disclosure and of the matching circuit according to Embodiment 2 of the present disclosure.
Figure 10:
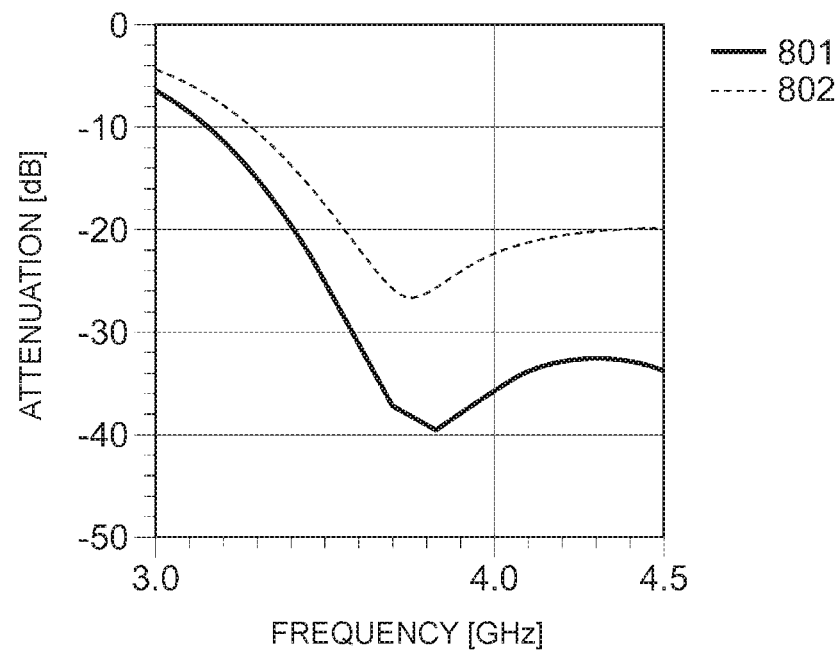
FIG. 10 is a graph illustrating simulation results of signal loss of the matching circuit according to Embodiment 1 of the present disclosure and of the matching circuit according to Embodiment 2 of the present disclosure.
Figure 11:
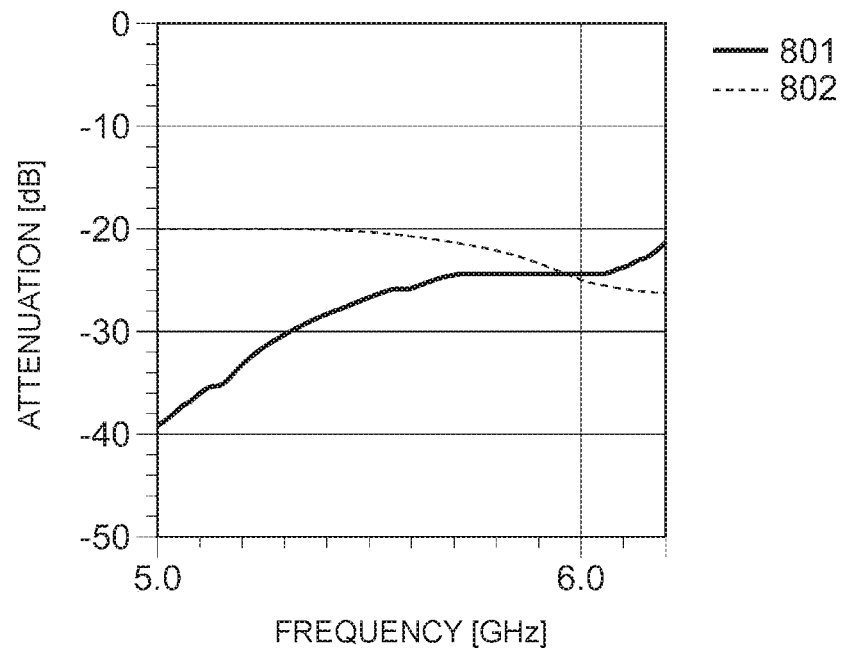
FIG. 11 is a graph illustrating simulation results of signal loss of the matching circuit according to Embodiment 1 of the present disclosure and of the matching circuit according to Embodiment 2 of the present disclosure.

FIG. 9 illustrates results of a simulation (to be referred to as "second simulation" hereinafter) of the respective signal losses of the matching circuits 10 and 20. In FIG. 9, the horizontal axis represents the frequency [GHz] of the amplified signal RFout1, and the vertical axis represents signal loss [dB]. The second simulation assumes that the carrier frequency band of the amplified signal RFout1 ranges from 1.710 GHz to 2.025 GHz. The second simulation also assumes that the low pass filter 40 of each of the matching circuits 10 and 20 attenuates the third harmonic component of the amplified signal RFout1. Further, the second simulation assumes that the parallel resonant circuit 60 attenuates the second harmonic component of the amplified signal RFout1. Reference numeral 801 indicates simulation results of signal loss of the matching circuit 20 according to Embodiment 2 obtained by the second simulation. Reference numeral 802 indicates simulation results of signal loss of the matching circuit 10 according to Embodiment 1 obtained by the second simulation. FIG. 10 is an enlarged view of the simulation results of FIG. 9 in the vicinity of the second harmonic frequency band of the amplified signal RFout1. FIG. 11 is an enlarged view of the simulation results of FIG. 9 in the vicinity of the third harmonic frequency band of the amplified signal RFout1. It is appreciated from the results of the simulation illustrated in FIGS. 9 to 11 that use of the parallel resonant circuit 60 enables sharp attenuation of the second harmonic component, and use of the low pass filter 40 enables moderate attenuation of the third harmonic component. In particular, the simulation results indicate that the addition of the parallel resonant circuit 60 improves signal loss for the second harmonic component by about 5 dB to about 12 dB. Further, the matching circuit 20 according to Embodiment 2 allows for reduced signal loss in the carrier frequency band.

Figure 12:
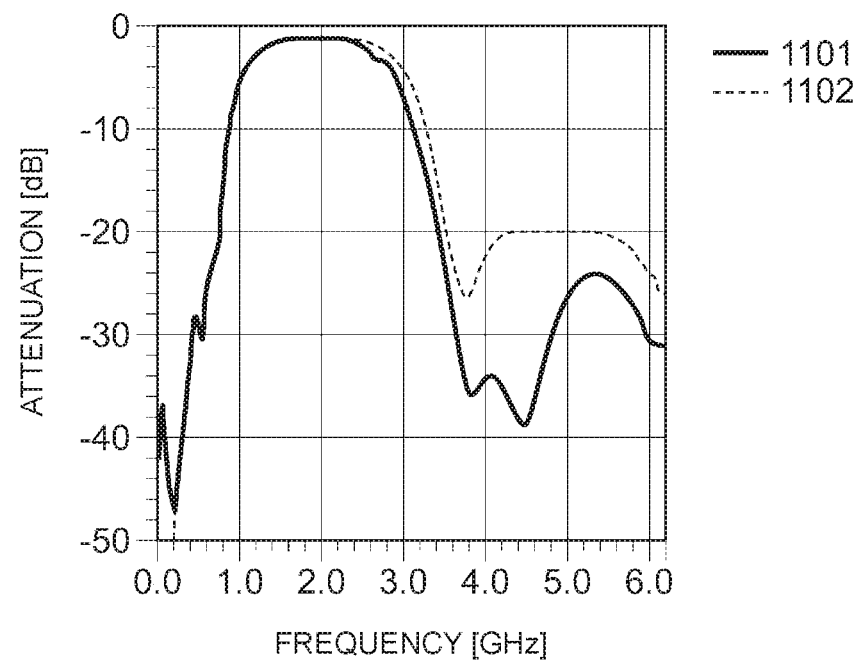
FIG. 12 is a graph illustrating simulation results of signal loss of the matching circuit according to Embodiment 1 of the present disclosure and of the matching circuit according to Embodiment 2 of the present disclosure.
Figure 13:
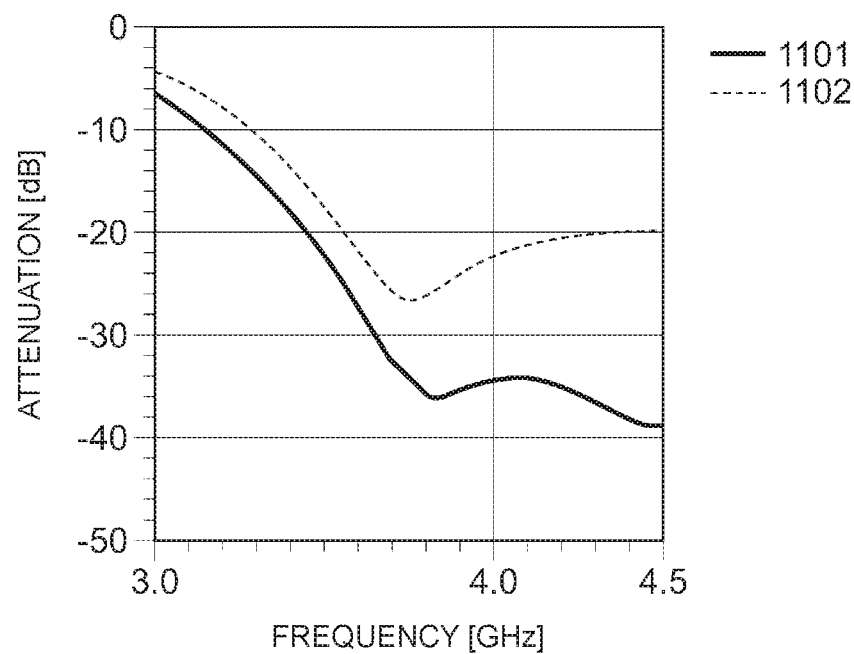
FIG. 13 is a graph illustrating simulation results of signal loss of the matching circuit according to Embodiment 1 of the present disclosure and of the matching circuit according to Embodiment 2 of the present disclosure.
Figure 14:
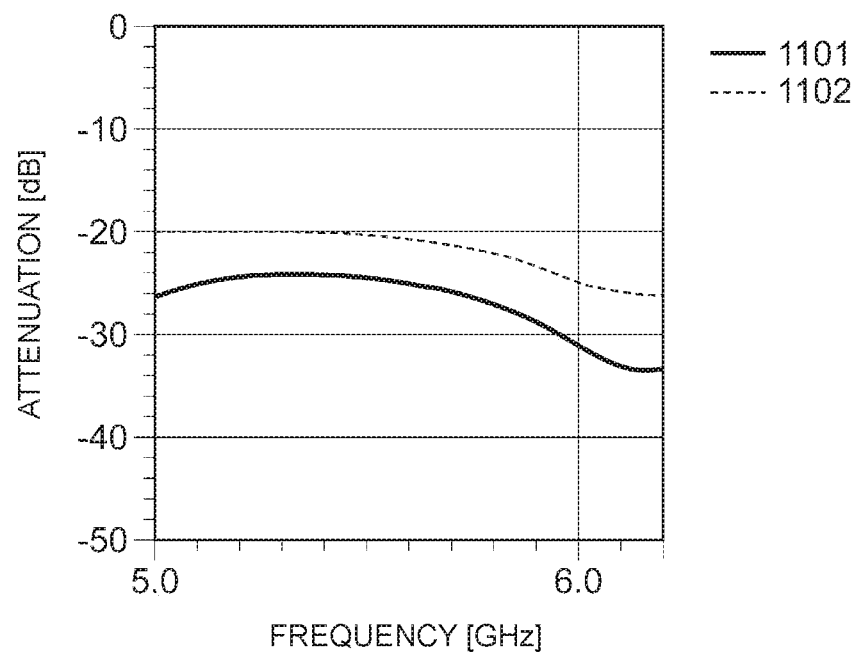
FIG. 14 is a graph illustrating simulation results of signal loss of the matching circuit according to Embodiment 1 of the present disclosure and of the matching circuit according to Embodiment 2 of the present disclosure.

FIG. 12 illustrates results of a simulation (to be referred to as "third simulation" hereinafter) of the respective signal losses of the matching circuits 10 and 20. In FIG. 12, the horizontal axis represents the frequency [GHz] of the amplified signal RFout1, and the vertical axis represents signal loss [dB]. The third simulation assumes that the carrier frequency band of the amplified signal RFout1 ranges from 1.710 GHz to 2.025 GHz. The third simulation also assumes that the low pass filter 40 of each of the matching circuits 10 and 20 attenuates the second harmonic component of the amplified signal RFout1. Further, the third simulation assumes that the parallel resonant circuit 60 attenuates the third harmonic component of the amplified signal RFout1. Reference numeral 1101 indicates simulation results of signal loss of the matching circuit 20 according to Embodiment 2 obtained by the third simulation. Reference numeral 1102 indicates simulation results of signal loss of the matching circuit 10 according to Embodiment 1 obtained by the third simulation. FIG. 13 is an enlarged view of the simulation results of FIG. 12 in the vicinity of the second harmonic frequency band of the amplified signal RFout1. FIG. 14 is an enlarged view of the simulation results of FIG. 12 in the vicinity of the third harmonic frequency band of the amplified signal RFout1. The results of the third simulation illustrated in FIGS. 12 to 14 reveal that the matching circuit 20 according to Embodiment 2 enables attenuation of the second and third harmonic components over a wider frequency range than the matching circuit 10 according to Embodiment 1.

Figure 15:
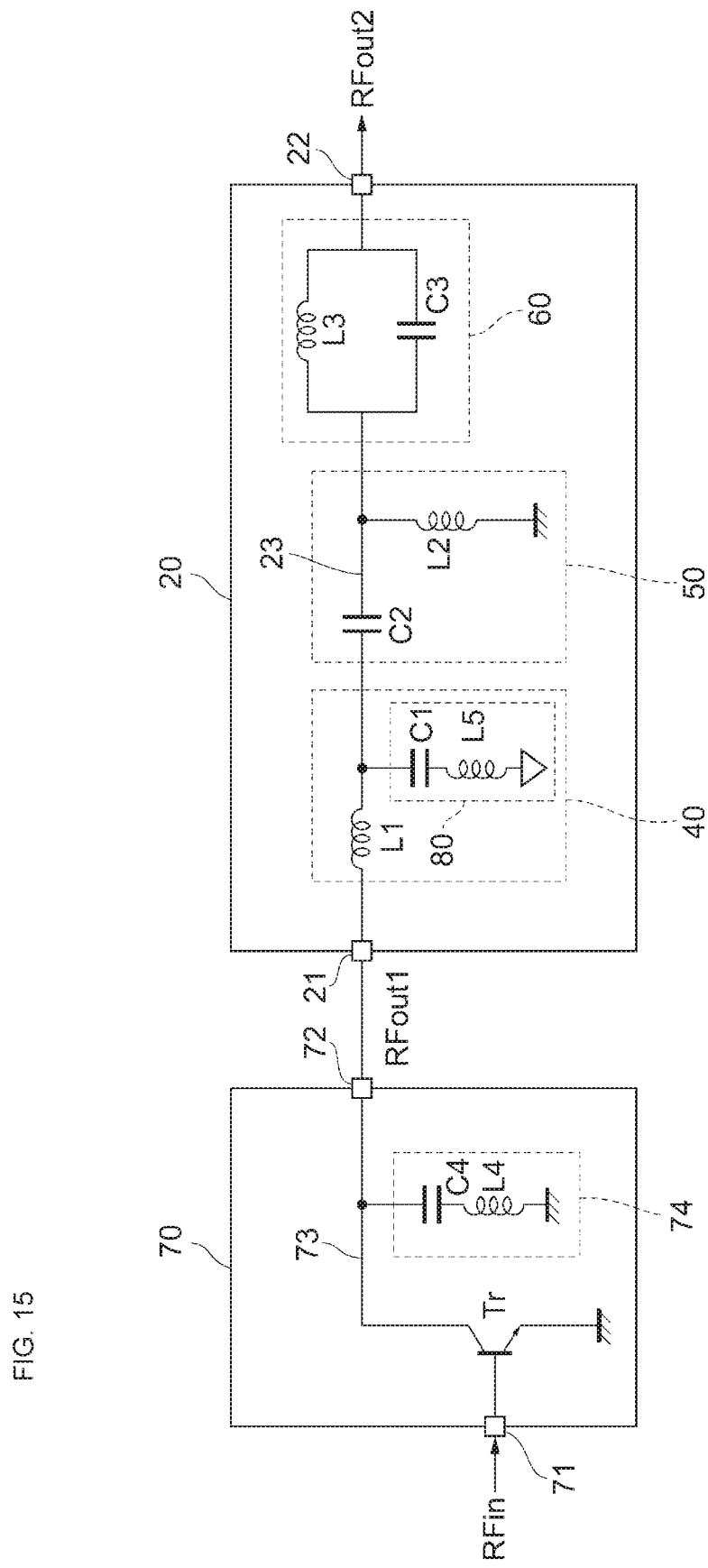
FIG. 15 illustrates a circuit configuration of the matching circuit according to Embodiment 2 of the present disclosure.

As illustrated in FIG. 15, the low pass filter 40 of the matching circuit 20 may include the high frequency terminating circuit 80. The high frequency terminating circuit 80 is an LC series resonant circuit including the capacitor element C1 and the inductor element L5 that are connected in series between the signal line 23 and the ground. The series resonant frequency of the LC series resonant circuit matches the frequency of a harmonic component (e.g., the second, third, or higher harmonic component) of the amplified signal RFout1. This configuration enables the high frequency terminating circuit 80 to attenuate a harmonic component of the amplified signal RFout1. For example, the high frequency terminating circuit 80 of the low pass filter 40 attenuates the third harmonic component of the amplified signal RFout1, and the parallel resonant circuit 60 attenuates the second harmonic component of the amplified signal RFout1. Alternatively, the high frequency terminating circuit 80 of the low pass filter 40 attenuates the second harmonic component of the amplified signal RFout1, and the parallel resonant circuit 60 attenuates the third harmonic component of the amplified signal RFout1.

With the matching circuit 20 according to Embodiment 2, the low pass filter 40 attenuates the third harmonic component of the amplified signal RFout1, and the parallel resonant circuit 60 attenuates the second harmonic component of the amplified signal RFout1. This configuration enables sharp attenuation of the second harmonic component as well as moderate attenuation of the third harmonic component, thus enabling attenuation of harmonic components over a wide frequency range. This configuration also allows for reduced signal loss in the carrier frequency band. Alternatively, the matching circuit 20 according to Embodiment 2 may be adapted such that the low pass filter 40 attenuates the second harmonic component of the amplified signal RFout1, and the parallel resonant circuit 60 attenuates the third harmonic component of the amplified signal RFout1. This enables attenuation of the second and third harmonic components over a wide frequency range.

Figure 16:
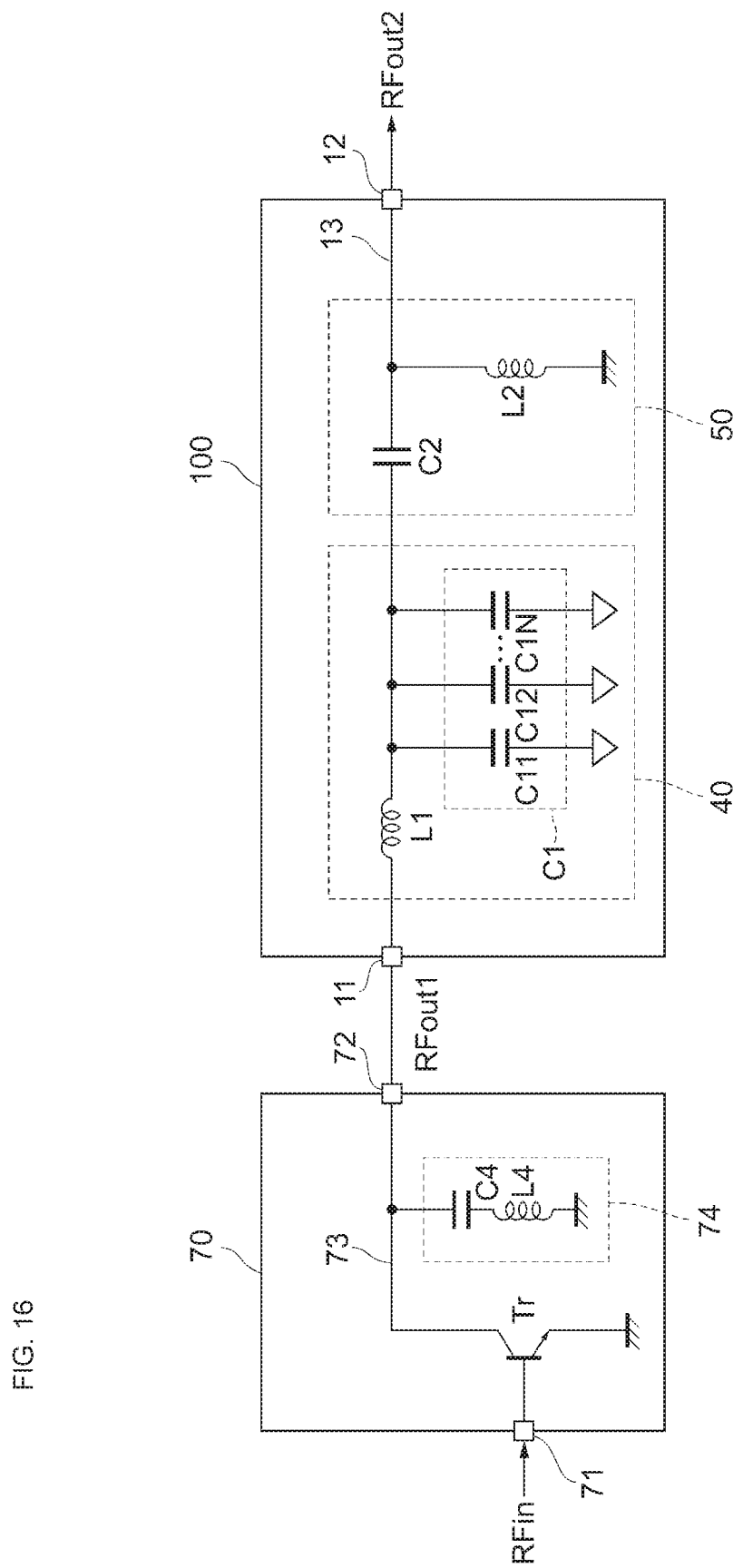
FIG. 16 illustrates a circuit configuration of a matching circuit according to Embodiment 3 of the present disclosure.

FIG. 16 illustrates a circuit configuration of a matching circuit 100 according to Embodiment 3 of the present disclosure. The matching circuit 100 according to Embodiment 3 differs from the matching circuit 10 according to Embodiment 1 in that the capacitor element C1 constituting the low pass filter 40 is formed by a parallel connection circuit of N capacitor elements C11, C12, . . . , and C1N. In this case, N is an integer equal to or greater than 2. The multiple capacitor elements C11, C12, . . . , and C1N are connected in shunt between the ground of the low pass filter 40 and the signal line 13, and these capacitor elements are equivalently regarded as a single capacitor element C1. In this case, the capacitance value of each of the capacitor elements C11, C12, . . . , and C1N of the matching circuit 100 according to Embodiment 3 is selected such that the combined capacitance value of the multiple capacitor elements C11, C12, . . . , and C1N is equal to the capacitance value of the capacitor element C1 of the matching circuit 10 according to Embodiment 1. For example, the capacitance value of each of the capacitor elements C11, C12, . . . , and C1N is 1/N of the capacitance value of the capacitor element C1 of the matching circuit 10 according to Embodiment 1.

Figure 17:
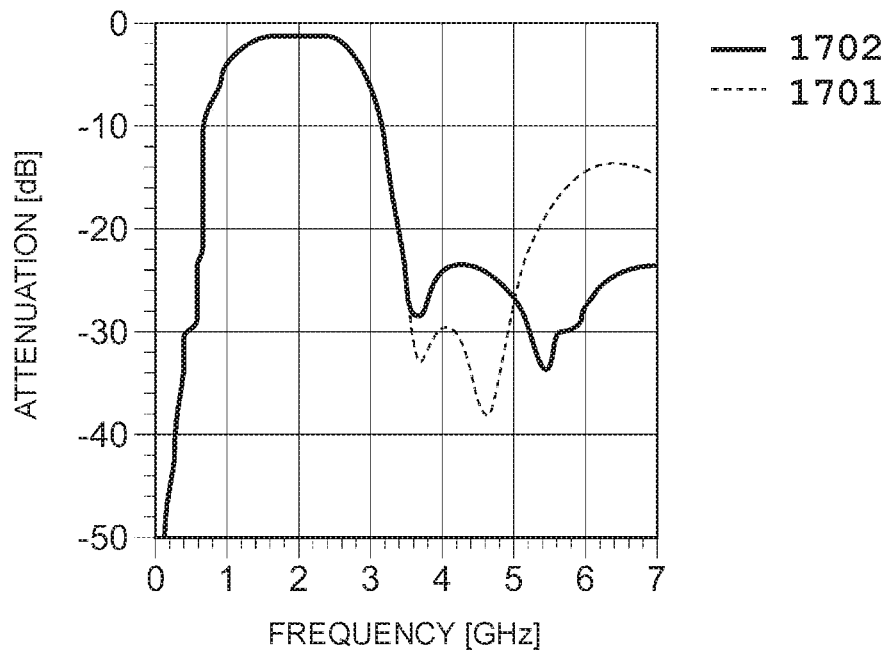
FIG. 17 is a graph illustrating simulation results of signal loss of the matching circuit according to Embodiment 3 of the present disclosure.
Figure 18:
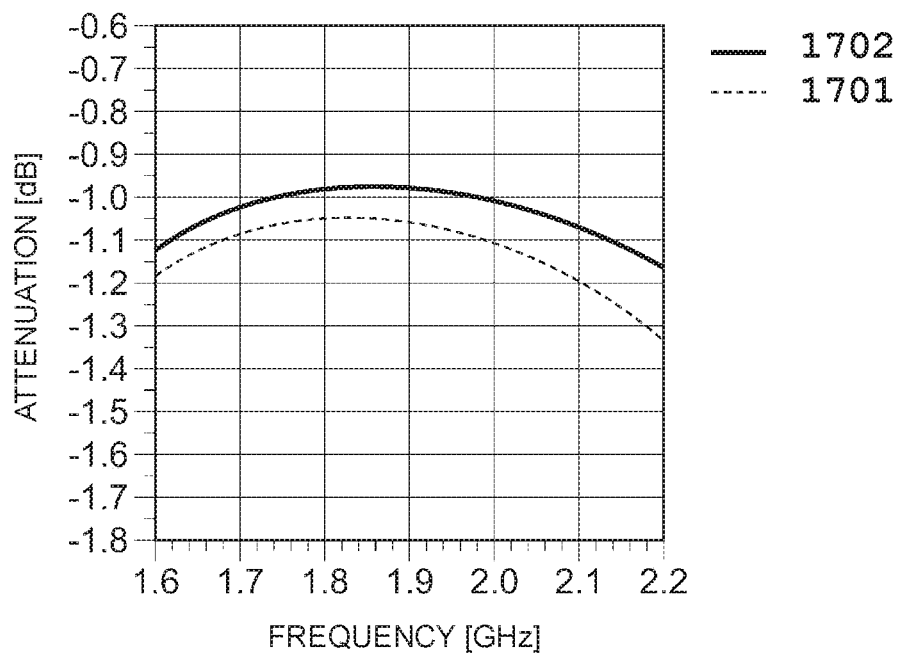
FIG. 18 is a graph illustrating simulation results of signal loss of the matching circuit according to Embodiment 3 of the present disclosure.

FIG. 17 illustrates results of a simulation of the respective signal losses of the matching circuits 10 and 100. In FIG. 17, the horizontal axis represents the frequency [GHz] of the amplified signal RFout1, and the vertical axis represents signal loss [dB]. This simulation assumes that the carrier frequency band of the amplified signal RFout1 ranges from 1.710 GHz to 2.025 GHz. Reference numeral 1701 indicates simulation results of signal loss of the matching circuit 10 according to Embodiment 1. Reference numeral 1702 indicates simulation results of signal loss of the matching circuit 100 according to Embodiment 3 for when N=2. FIG. 18 is an enlarged view of the simulation results of FIG. 17 in the vicinity of the carrier frequency band. It is appreciated from these simulation results that when the capacitor element C1 is constructed from two capacitor elements with equal capacitance values, signal loss in the carrier frequency band is improved by 0.101 dB in comparison to when the capacitor element C1 is constructed from a single capacitor element. Presumably, this is because constructing the capacitor element C1 from two capacitor elements with equal capacitance values leads to reduced insertion loss of the low pass filter 40 and improved quality factor (Q-factor).

Figure 19:
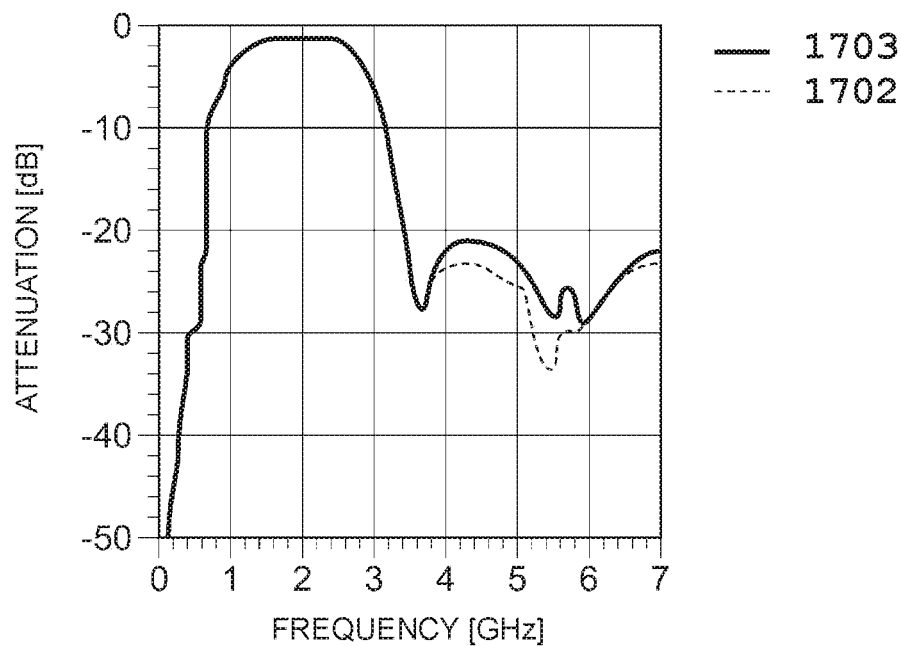
FIG. 19 is a graph illustrating simulation results of signal loss of the matching circuit according to Embodiment 3 of the present disclosure.
Figure 20:
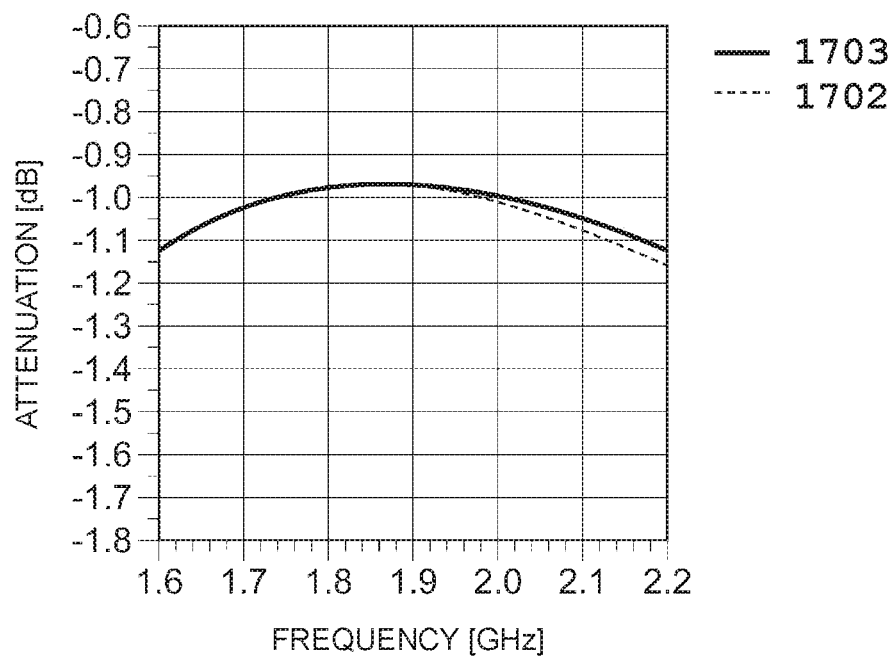
FIG. 20 is a graph illustrating simulation results of signal loss of the matching circuit according to Embodiment 3 of the present disclosure.

FIG. 19 illustrates simulation results of signal loss of the matching circuit 100 for when N=2 and for when N=3. In FIG. 19, the horizontal axis represents the frequency [GHz] of the amplified signal RFout1, and the vertical axis represents signal loss [dB]. This simulation assumes that the carrier frequency band of the amplified signal RFout1 ranges from 1.710 GHz to 2.025 GHz. Reference numeral 1703 indicates simulation results of signal loss of the matching circuit 100 according to Embodiment 3 for when N=3. FIG. 20 is an enlarged view of the simulation results of FIG. 19 in the vicinity of the carrier frequency band. It is appreciated from these simulation results that when the capacitor element C1 is constructed from three capacitor elements with equal capacitance values, signal loss in the carrier frequency band is improved by 0.015 dB in comparison to when the capacitor element C1 is constructed from two capacitor elements with equal capacitance values.

Figure 21:
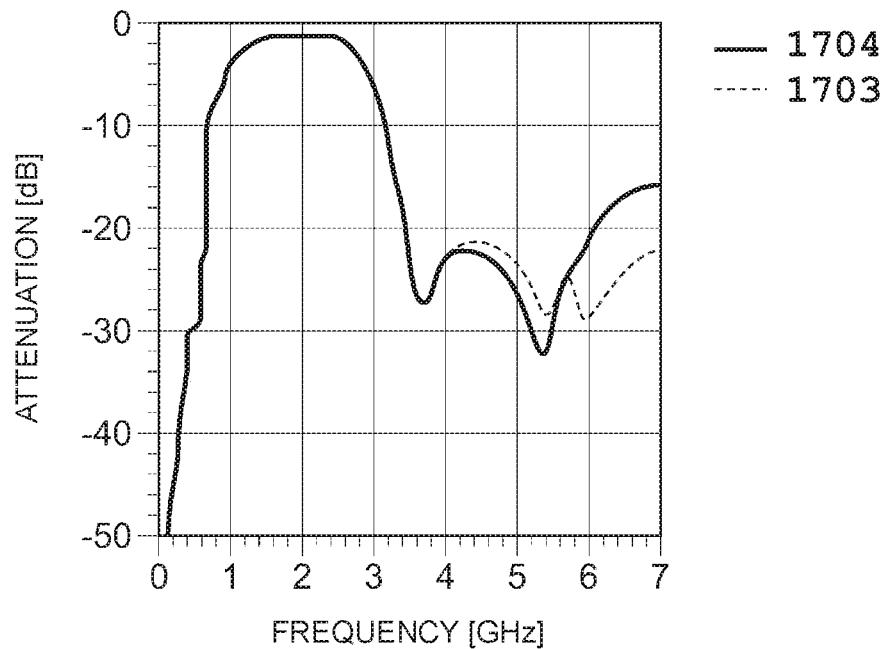
FIG. 21 is a graph illustrating simulation results of signal loss of the matching circuit according to Embodiment 3 of the present disclosure.
Figure 22:
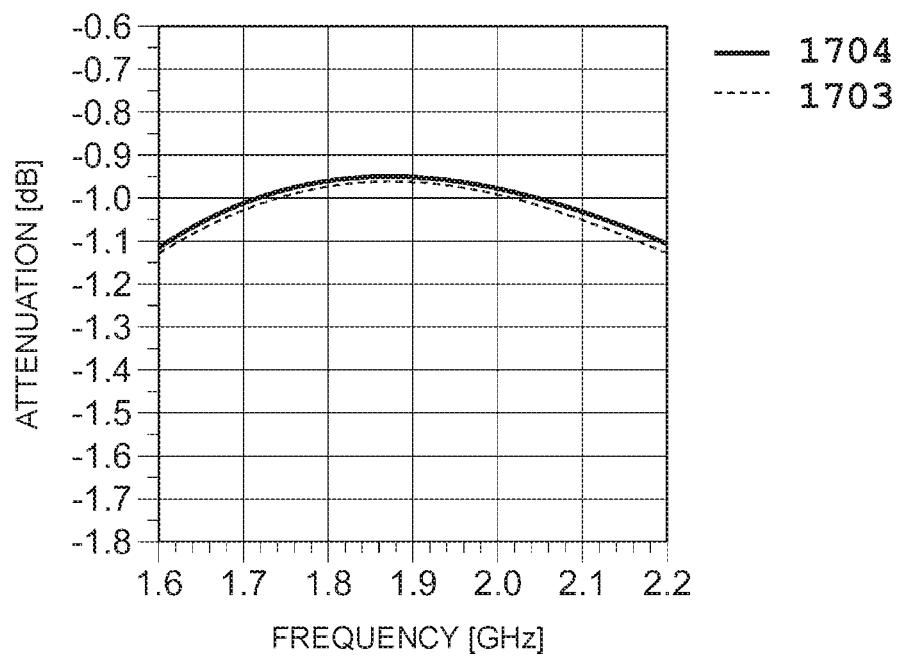
FIG. 22 is a graph illustrating simulation results of signal loss of the matching circuit according to Embodiment 3 of the present disclosure.

FIG. 21 illustrates simulation results of signal loss of the matching circuit 100 for when N=3 and for when N=4. In FIG. 21, the horizontal axis represents the frequency [GHz] of the amplified signal RFout1, and the vertical axis represents signal loss [dB]. This simulation assumes that the carrier frequency band of the amplified signal RFout1 ranges from 1.710 GHz to 2.025 GHz. Reference numeral 1704 indicates simulation results of signal loss of the matching circuit 100 according to Embodiment 3 for when N=4. FIG. 22 is an enlarged view of the simulation results of FIG. 21 in the vicinity of the carrier frequency band. It is appreciated from these simulation results that when the capacitor element C1 is constructed from four capacitor elements with equal capacitance values, signal loss in the carrier frequency band is improved by 0.016 dB in comparison to when the capacitor element C1 is constructed from three capacitor elements with equal capacitance values.

Figure 23:
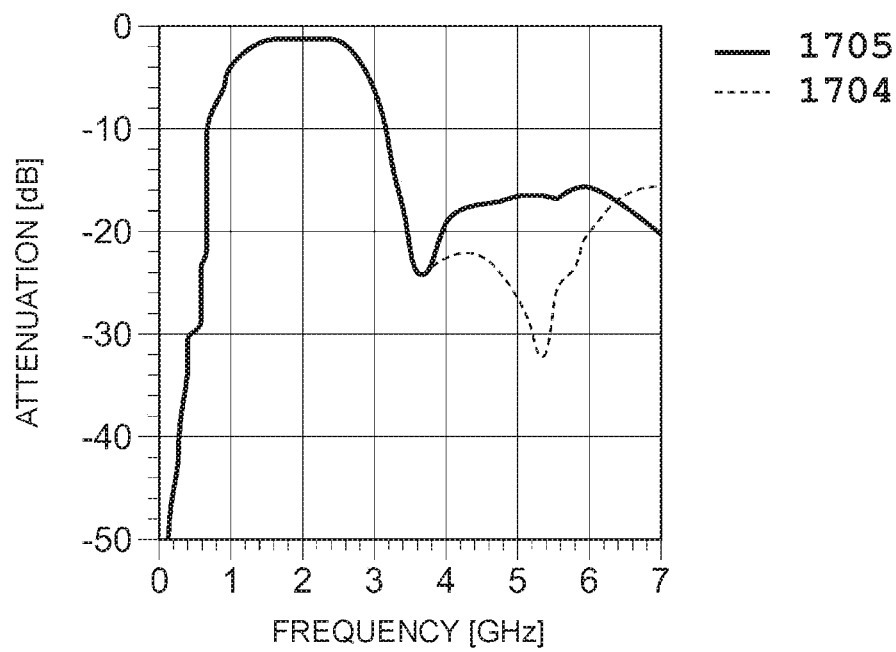
FIG. 23 is a graph illustrating simulation results of signal loss of the matching circuit according to Embodiment 3 of the present disclosure.
Figure 24:
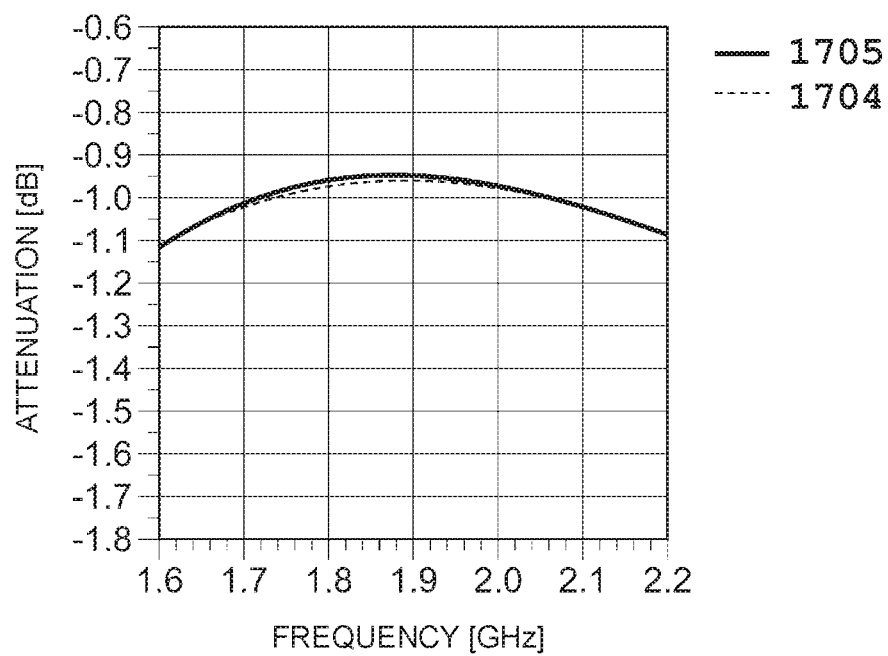
FIG. 24 is a graph illustrating simulation results of signal loss of the matching circuit according to Embodiment 3 of the present disclosure.

FIG. 23 illustrates simulation results of signal loss of the matching circuit 100 for when N=4 and for when N=5. In FIG. 23, the horizontal axis represents the frequency [GHz] of the amplified signal RFout1, and the vertical axis represents signal loss [dB]. This simulation assumes that the carrier frequency band of the amplified signal RFout1 ranges from 1.710 GHz to 2.025 GHz. Reference numeral 1705 indicates simulation results of signal loss of the matching circuit 100 according to Embodiment 3 for when N=5. FIG. 24 is an enlarged view of the simulation results of FIG. 23 in the vicinity of the carrier frequency band. It is appreciated from these simulation results that signal loss in the carrier frequency band differs little between when the capacitor element C1 is constructed from four capacitor elements with equal capacitance values and when the capacitor element C1 is constructed from five capacitor elements with equal capacitance values.

Figure 25:
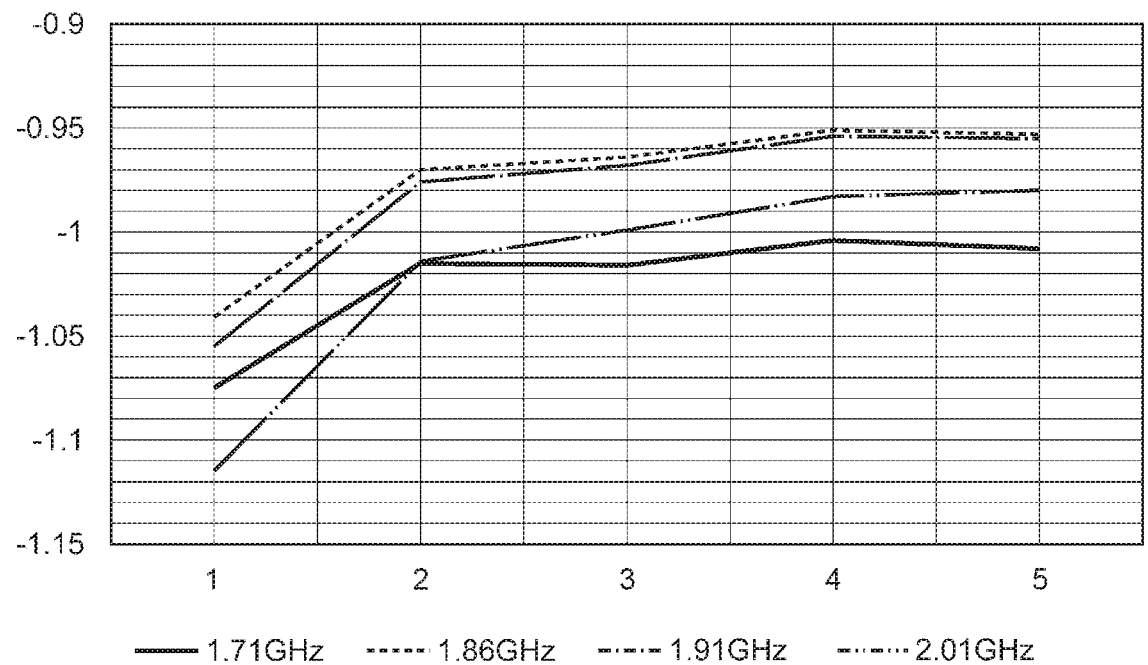
FIG. 25 is a graph illustrating the relationship between signal loss and the number of capacitor elements constituting the capacitor element of the matching circuit according to Embodiment 3 of the present disclosure.

Table illustrates signal loss [dB] in the carrier frequency band (at 1.71 GHz, 1.86 GHz, 1.91 GHz, and 2.01 GHz) when the number of capacitor elements constituting the capacitor element C1 is varied from 1 to 5. FIG. 25 is a graph representing the results illustrated in Table. In FIG. 25, the horizontal axis represents the number of capacitor elements constituting the capacitor element C1, and the vertical axis represents signal loss [dB].

TABLE

|  | 1 | 2 | 3 | 4 | 5 |
| --- | --- | --- | --- | --- | --- |
| 1.71 GHz | −1.075 | −1.015 | −1.016 | −1.004 | −1.008 |
| 1.86 GHz | −1.041 | −0.97 | −0.964 | −0.951 | −0.953 |
| 1.91 GHz | −1.055 | −0.976 | −0.968 | −0.954 | −0.955 |
| 2.01 GHz | −1.155 | −1.014 | −0.999 | −0.983 | −0.98 |

The capacitor element C1 constituting the low pass filter 40 of the matching circuit 20 according to Embodiment 2 may be formed by a parallel connection circuit of N capacitor elements C11, C12, . . . , and C1N. In this case, the low pass filter 40 may attenuate the third harmonic component of the amplified signal RFout1, and the parallel resonant circuit 60 may attenuate the second harmonic component of the amplified signal RFout1. Alternatively, the low pass filter 40 may attenuate the second harmonic component of the amplified signal RFout1, and the parallel resonant circuit 60 may attenuate the third harmonic component of the amplified signal RFout1.

The inductor element L1 constituting the low pass filter 40 may be formed by a parallel connection circuit of multiple inductor elements equivalently regarded as a single inductor element L1. Likewise, the capacitor element C2 constituting the high pass filter 50 may be formed by a parallel connection circuit of multiple capacitor elements equivalently regarded as a single capacitor element C2. Likewise, the inductor element L2 constituting the high pass filter 50 may be formed by a parallel connection circuit of multiple inductor elements equivalently regarded as a single inductor element L2.

The foregoing description of the embodiments is provided to facilitate understanding of the present invention and not to be construed as limiting the present invention. It is to be understood that various modifications or improvements may be made to the present invention without departing from the spirit and scope of the present invention, and the present invention encompasses equivalents thereof. In other words, any suitable design modifications made to the embodiments by those skilled in the art fall within the scope of the present invention as long as such modifications include features of the present invention. Features such as various circuit elements included in the embodiments and their placement or layout are not limited to the particular details illustrated but may be modified as appropriate. For example, when it is stated in the foregoing description that "a circuit element A is connected to a circuit element B", this includes not only cases where the circuit element A is directly connected to the circuit element B but also cases where a signal path can be selectively established between the circuit element A and the circuit element B with a circuit element C (e.g., a switching element) interposed therebetween. Further, various circuit elements included in the embodiments may be combined as long as such combinations are technically feasible, and any such combinations that include the features of the present invention fall within the scope of the present invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A matching circuit that performs output impedance matching for an amplifier, the matching circuit comprising:
   a low pass filter comprising a shared ground and a plurality of parallel-connected capacitors, the plurality of parallel-connected capacitors being connected from a common node on a signal line to the shared ground in order to attenuate a second harmonic component of an amplified signal;
   a high pass filter connected to the low pass filter, the high pass filter configured to cancel out a change of an impedance of the low pass filter; and
   a parallel resonant circuit connected to the high pass filter to receive the amplified signal with the second harmonic component attenuated, the parallel resonant circuit configured to attenuate a third harmonic component of the received amplified signal,
   wherein the shared ground of the plurality of parallel-connected capacitors of the low pass filter and a ground of the high pass filter are isolated from each other in order to prevent the third harmonic component of the amplified signal attenuated by the low pass filter from entering the high pass filter, and
   wherein the shared ground of the low pass filter and a ground of the amplifier are isolated from each other, the low pass filter comprising the plurality of parallel-connected capacitors connected from the common node.

2. The matching circuit according to claim 1, wherein the low pass filter includes an LC series resonant circuit configured to attenuate the second harmonic component of the amplified signal.

3. The matching circuit according to claim 1, wherein the low pass filter further comprises:
   an inductor connected to the common node and in series with the signal line of the low pass filter.

4. A matching circuit that performs output impedance matching for an amplifier, the matching circuit comprising:
   a low pass filter comprising a shared ground and a plurality of parallel-connected capacitors, the plurality of parallel-connected capacitors being connected from a common node on a signal line to the shared ground, the low pass filter being configured to attenuate a second harmonic component of an amplified signal;
   a high pass filter; and
   a parallel resonant circuit connected to the high pass filter to receive the amplified signal with the second harmonic component attenuated, the parallel resonant circuit configured to attenuate a third harmonic component of an amplified signal,
   wherein the shared ground of the plurality of parallel-connected capacitors of the low pass filter and a ground of the high pass filter are isolated from each other with a wiring pattern of the matching circuit therebetween, and
   wherein the shared ground of the low pass filter and a ground of the amplifier are isolated from each other.

5. The matching circuit according to claim 4, wherein the low pass filter further comprises:
   an inductor connected to the common node and in series with the signal line of the low pass filter.

6. The matching circuit according to claim 4,
   wherein the high pass filter is configured to cancel out a change of an impedance of the low pass filter, and
   wherein the shared ground of the plurality of parallel-connected capacitors of the low pass filter and the ground of the high pass filter are isolated from each other such that the second harmonic component of the amplified signal attenuated by the low pass filter is prevented from entering the high pass filter.

* * * * *